(12) United States Patent
Clevenger et al.

(10) Patent No.: US 6,759,332 B2
(45) Date of Patent: Jul. 6, 2004

(54) METHOD FOR PRODUCING DUAL DAMASCENE INTERCONNECTIONS AND STRUCTURE PRODUCED THEREBY

(75) Inventors: Lawrence A. Clevenger, LaGrangeville, NY (US); Larry A. Nesbit, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 206 days.

(21) Appl. No.: 09/772,920

(22) Filed: Jan. 31, 2001

(65) Prior Publication Data

US 2002/0100983 A1 Aug. 1, 2002

(51) Int. Cl.[7] .............................................. H01L 21/44
(52) U.S. Cl. ...................... 438/687; 438/638; 438/618; 438/626; 438/631; 438/634; 438/648; 438/637; 438/700; 438/702; 438/703; 438/644; 438/672; 438/675; 438/687; 438/666; 438/629; 257/751; 257/752; 257/764; 257/763; 257/762; 427/250
(58) Field of Search ................................ 438/687, 629, 438/672, 638, 618, 626, 631, 634, 648, 637, 700, 702, 703, 644, 675, 566, 622; 257/751, 752, 764, 763, 762, E21.57, E21.02, 774, 758; 427/250

(56) References Cited

U.S. PATENT DOCUMENTS

| | | | | |
|---|---|---|---|---|
| 5,529,953 A | * | 6/1996 | Shoda .......................... | 438/644 |
| 5,612,254 A | * | 3/1997 | Mu et al. ...................... | 438/634 |
| 5,939,788 A | * | 8/1999 | McTeer ........................ | 257/751 |
| 6,123,992 A | * | 9/2000 | Sugai ........................... | 427/250 |
| 6,165,898 A | * | 12/2000 | Jang et al. .................... | 438/638 |
| 6,225,207 B1 | * | 5/2001 | Parikh .......................... | 438/622 |
| 6,284,642 B1 | * | 9/2001 | Liu et al. ...................... | 438/622 |
| 6,313,003 B1 | * | 11/2001 | Chen ............................ | 438/396 |
| 6,319,813 B1 | * | 11/2001 | Givens ......................... | 438/624 |
| 6,319,821 B1 | * | 11/2001 | Liu et al. ...................... | 438/636 |

OTHER PUBLICATIONS

S. Wolf, Silicon Processing For The VLSI Era–2, 1990, p194.*

* cited by examiner

Primary Examiner—Matthew Smith
Assistant Examiner—Belur V Keshavan
(74) Attorney, Agent, or Firm—Robert M. Trepp, Esq.; McGinn & Gibb, PLLC

(57) ABSTRACT

A method (and structure) of forming an interconnect on a semiconductor substrate, includes forming a relatively narrow first structure in a dielectric formed on a semiconductor substrate, forming a relatively wider second structure in the dielectric formed on the semiconductor substrate, forming a liner in the first and second structures such that the first structure is substantially filled and the second structure is substantially unfilled, and forming a metallization over the liner to completely fill the second structure.

24 Claims, 3 Drawing Sheets

METHOD FOR PRODUCING DUAL DAMASCENE INTERCONNECTIONS AND STRUCTURE PRODUCED THEREBY

BACKGROUND OF THE INVENTION

1. Field of the Invention

The present invention generally relates to a method (and resultant structure) of forming a semiconductor device, and more particularly to a method (and resultant structure) of forming a dual damascene interconnection.

2. Description of the Related Art

Currently, it is difficult to adequately line contacts for copper filling at contact dimensions below 280 nm, and to line contacts reliably below contact opening sizes of less than 320 nm. This presents a major challenge to dynamic random access memory back-end-of-line (DRAM BEOL) processing that would like to migrate to a copper back-end in the near future.

Additionally, in the conventional methods, there are a large number of types of conducting materials that must be implemented in a BEOL process.

Further, the conventional methods require a separate method for producing DRAM BEOL and a separate method for producing the logic BEOL so that different manufacturing lines are required to produce either DRAM or logic with the same type and number of tools.

Finally, the conventional methods typically attempt to fill substantially both small and large structures with copper, thereby requiring additional and costly processing such as multiple CVD and advanced PVD diffusion barriers and liners which enable Cu plating.

SUMMARY OF THE INVENTION

In view of the foregoing problems, drawbacks, and disadvantages of the conventional methods, it is an object of the present invention to provide a structure and method for producing a dual damascene structure.

Another object is to fill small contacts with a highly reliable material and fill wider metal lines with, for example, copper.

In a first aspect of the present invention, a method of forming an interconnect on a semiconductor substrate, includes forming a relatively narrow first structure in a dielectric formed on a semiconductor substrate, forming a relatively wider second structure in the dielectric formed on the semiconductor substrate, forming a liner in the first and second structures such that the first structure is substantially filled and the second structure is substantially unfilled, and forming a metallization over the liner to completely fill the second structure.

In a second aspect, a method of forming an interconnect on a semiconductor substrate, includes forming a contact, including a slot, in a dielectric formed on a semiconductor substrate, forming troughs in the dielectric, thereby to form a dual damascene structure (it is noted that the order in which these levels are masked and etched may be reversed), depositing a thick conducting material on the dielectric, depositing a metal over the conducting material to completely fill the slot and metal troughs, removing the metal either to the conducting material or both the metal and the conducting material simultaneously back to the dielectric, and selectively removing the conducting material.

In a third aspect, a semiconductor device, includes a semiconductor substrate, a dual damascene structure formed in at least one dielectric film formed on the semiconductor substrate, including a relatively narrow first structure and a relatively wider second structure, a liner formed in the first and second structures such that the first structure is substantially filled and the second structure is substantially unfilled, and a metallization formed over the liner to completely fill the second structure.

With the unique and unobvious advantages of the present invention, small contacts (e.g., C1 contacts) can be filled with a highly reliable material and wider metal lines (e.g., C1 slots) with, for example, copper.

Further, the invention provides a method for easily and adequately lining contacts for copper filling at contact dimensions below 280 nm, and to lining contacts reliably below contact opening sizes of less than 320 nm.

Moreover, the invention provides a method which is advantageous from a manufacturing perspective in which the number of types of conducting materials that must be implemented in a BEOL process is minimized. Also, the same method can be used to make the DRAM BEOL and the logic BEOL. Thus, a same manufacturing line can produce either DRAM or logic devices with the same type and number of tools.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF PREFERRED EMBODIMENTS OF THE INVENTION

Figure 1:
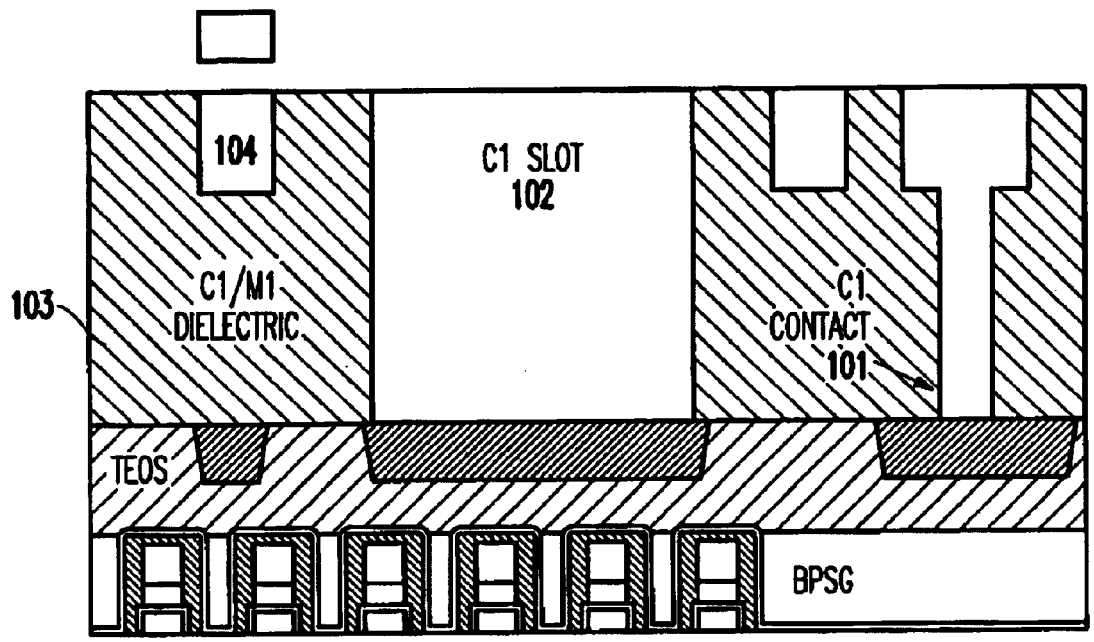
FIG. 1 is a schematic diagram of a cross-section of a semiconductor chip according to the present invention.

Referring now to the drawings, and more particularly to FIGS. 1–5, there are shown preferred embodiments of the method and structures according to the present invention.

Generally, the invention is directed to a method (and resulting structure) of forming a dual damascene interconnection.

Referring to FIG. 1, in a first step of the method, contacts 101 (e.g., C1 contacts between first and second metal levels M0 and M1), including C1 slots 102 are etched into the C1/M1 dielectric 103. This dielectric can be either a nitride/oxide, low K polymer or a combination thereof.

In step 2, M1 troughs 104 are etched into the C1/M1 TEOS (or dielectric) 103. Preferably, such an etch is performed by reactive ion etching (RIE). It is noted that the order in which these levels are masked and etched may be reversed.

Thus, FIG. 1 shows a cross-section of a semiconductor chip, showing the C1 contacts, C1 slots, and M1 troughs etched into the C1/M1 TEOS or dielectric to form a dual damascene structure.

Figure 2:
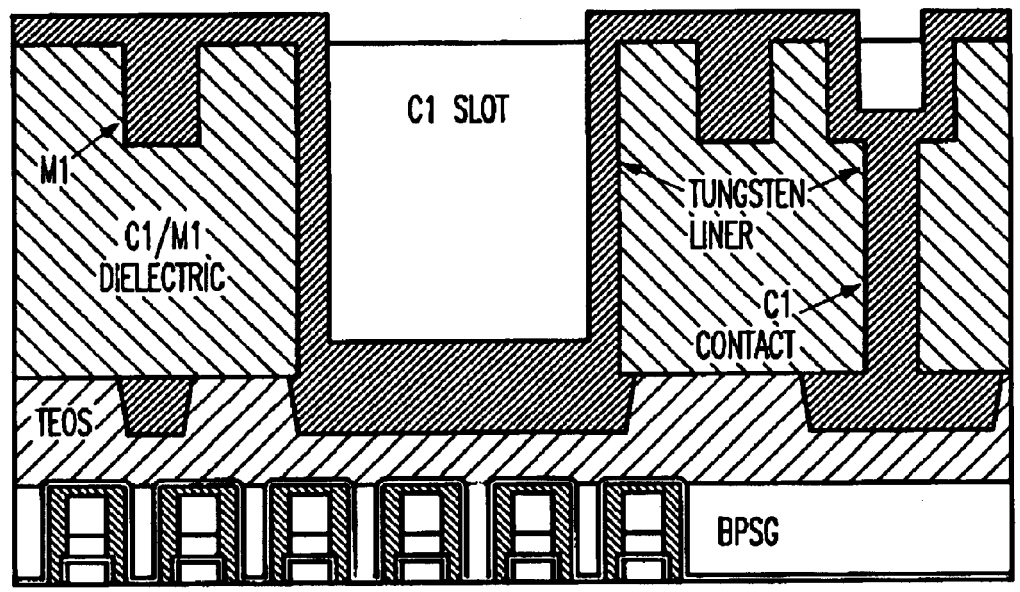
FIG. 2 is a cross-section of the chip (a wafer) after a tungsten fill.

Referring now to FIG. 2, a thick (e.g., <2000 Å) reliable conducting material(s), such as a chemical vapor-deposited (CVD) metal (e.g., tungsten) is deposited on the wafer. Instead of tungsten, titanium nitride, aluminum, etc. may be used. For illustration purposes only, it will be assumed that tungsten is employed.

The thickness of the conducting material(s) is adjusted so as to substantially completely fill the relatively small C1 contacts. The small C1 contacts are typically from about 2000 to about 8000 Å deep. Thus, FIG. 2 shows the wafer after the tungsten fill.

Figure 3:
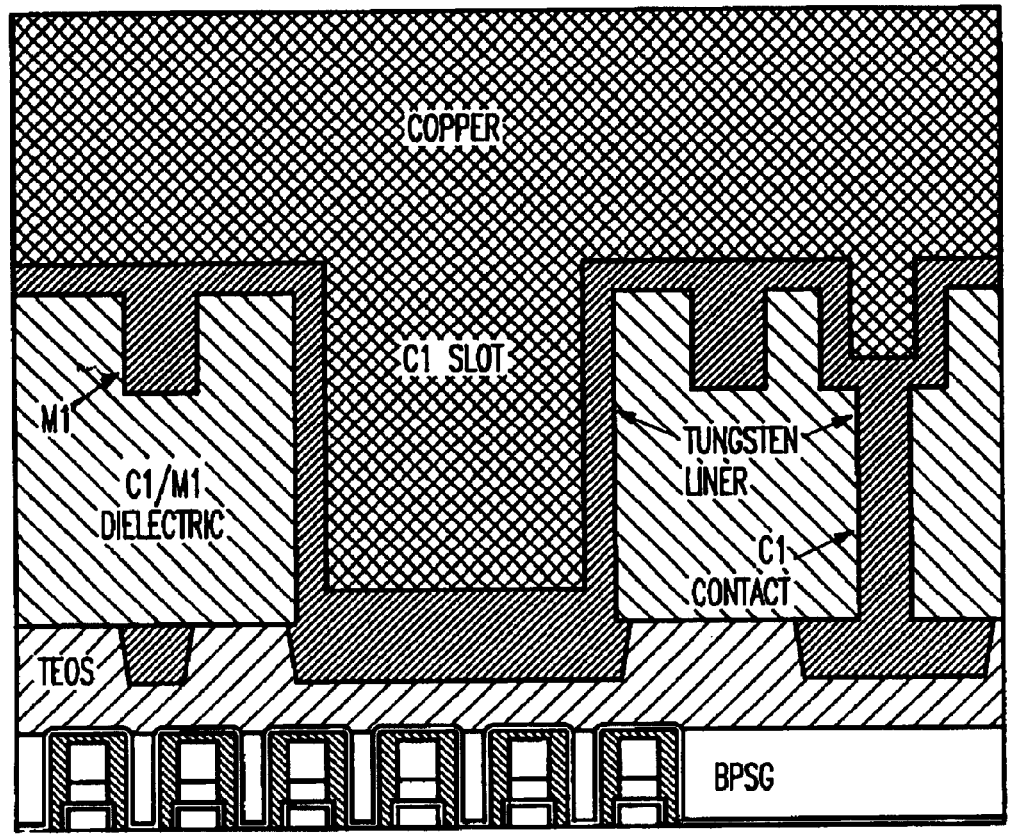
FIG. 3 is a cross-section of the semiconductor chip showing copper being formed over the tungsten.

Thereafter, as shown in FIG. 3, a metal like copper or any other conducting material different from the first metal deposition, is then deposited over the tungsten by plating, physical vapor deposition, or chemical vapor deposition to completely fill the relatively wider lines (e.g., C1 slots and the M1 metal troughs).

Figure 4:
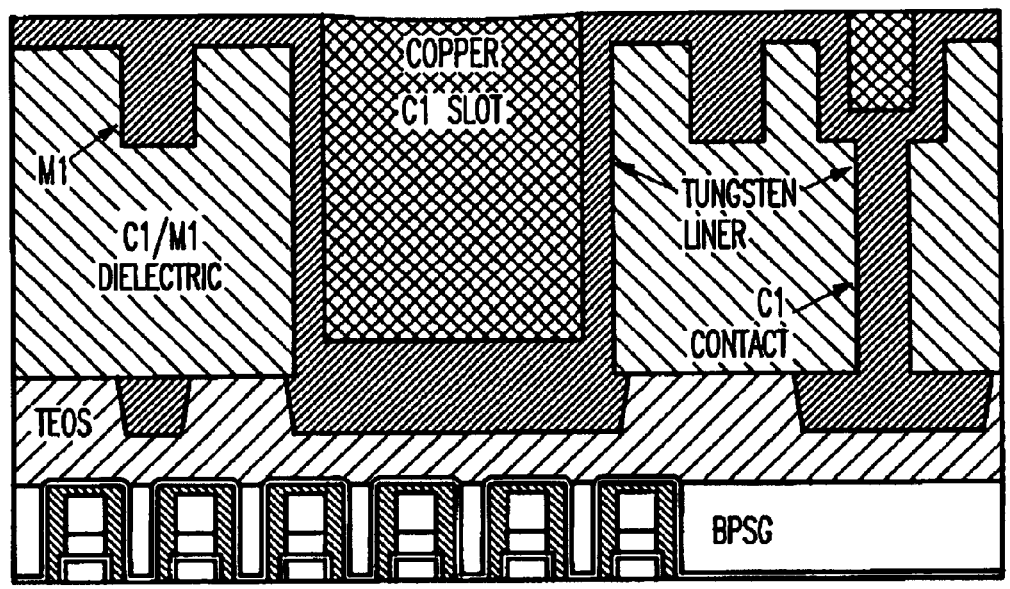
FIG. 4 is a cross-section of the semiconductor chip showing a removal of the copper over the tungsten other than that in a trough (e.g., C1 slot)

Thereafter in FIG. 4, the copper is polished back by CMP either to the contact fill material (e.g., tungsten) or both the copper and the contact fill material are simultaneously polished back to the dielectric.

Figure 5:
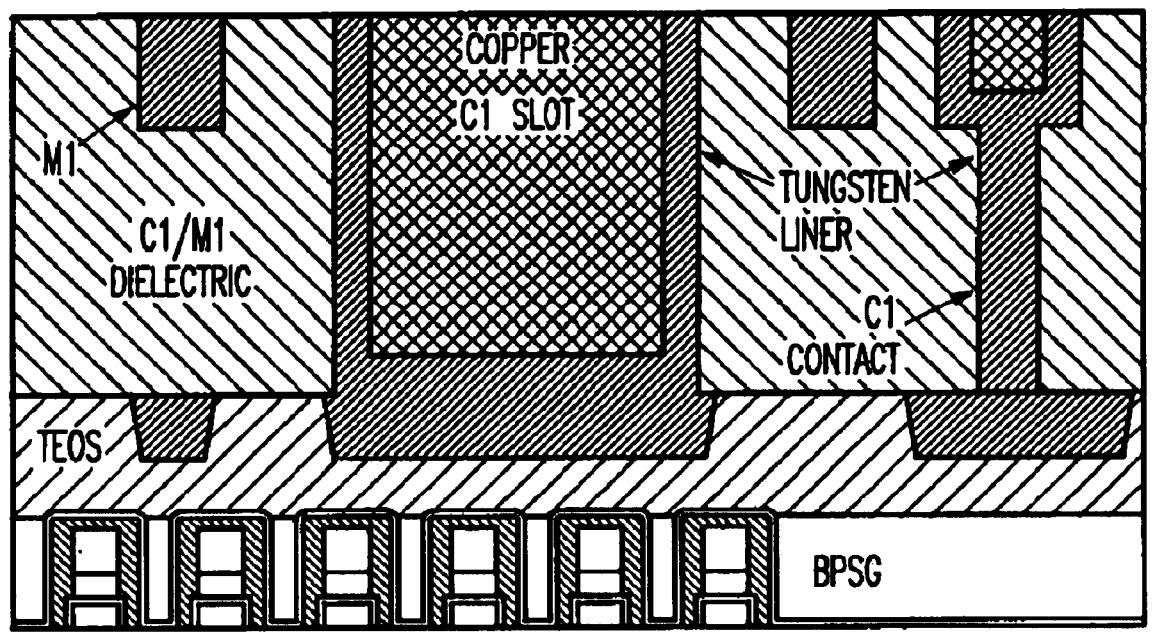
FIG. 5 is a wafer cross-section after selective removal of the tungsten, either by selective etching or chemical mechanical polishing (CMP).

Then, as shown in FIG. 5, the tungsten is selectively removed, either by a selective etch, or by a selective CMP. Subsequent dielectric films and metal layers may be deposited on the resulting structure. Thus, FIG. 5 illustrates the wafer cross-section after selective removal of the tungsten, either by selective etch or CMP.

With the unique and unobvious features of the present invention, small contacts (e.g., C1 contacts) can be filled with a highly reliable material (e.g., CVD metal) and wider metal lines (e.g., C1 slots) can be filled with, for example, copper. Thus, the invention fills the substantially smaller areas/structures with CVD metal, and the wider areas/structures are filled with copper metallization.

Further, the invention easily and adequately lines contacts for copper filling at contact dimensions below 280 nm, and lines contacts reliably below contact opening sizes of less than 320 nm.

Moreover, the invention provides a method which is advantageous from a manufacturing perspective in which the number of types of conducting materials that must be implemented in a BEOL process is minimized. Also, the same method can be used to make the DRAM BEOL and the logic BEOL. Thus, a same manufacturing line can produce either DRAM or logic devices with the same type and number of tools.

While the invention has been described in terms of preferred embodiments, those skilled in the art will recognize that the invention can be practiced with modification within the spirit and scope of the appended claims.

Having thus described our invention, what we claim as new and desire to secure by Letters Patent is as follows:

1. A method of forming an interconnect on a semiconductor substrate, comprising:
   forming a relatively narrow first structure in a dielectric formed on a semiconductor substrate;
   forming a relatively wider second structure in said dielectric;
   forming a liner in said relatively narrow first structure and said relatively wider second structure, such that a lower portion of said relatively narrow first structure is completely filled by said liner; and
   forming a metallization over said liner to completely fill said relatively wider second structure.

2. The method of claim 1, wherein said liner comprises one of a chemical vapor deposition (CVD) metal, a physical vapor deposition (PVD) metal and a plated liner.

3. The method of claim 1, wherein said liner comprises at least one of tungsten, aluminum, and titanium nitride.

4. The method of claim 1, wherein said metallization comprises copper.

5. The method of claim 1, wherein said relatively narrow first structure is not connected on said substrate to said relatively wider second structure.

6. The method of claim 1, wherein said forming a relatively wider second structure forms said wider structure on said substrate apart from said relatively narrow structure.

7. A method of forming an interconnect on a semiconductor substrate, comprising:
   forming a contact in a dielectric formed on a semiconductor substrate;
   the contact forming includes forming troughs into the dielectric, whereby a dual damascene structure is formed;
   depositing a conducting material on the dielectric that completely fills a lower portion of the dual damascene structure;
   depositing a metal over the conducting material to completely fill the troughs;
   removing a portion of the metal; and
   selectively removing the conducting material.

8. The method of claim 7, wherein said dielectric comprises one of tetraethylorthosilicate (TEOS), silane and another low K polymer dielectric.

9. The method of claim 8, wherein said contact is formed between first and second metal levels formed on the semiconductor substrate.

10. The method of claim 7, wherein said conducting material comprises tungsten.

11. The method of claim 10, wherein the tungsten comprises chemical vapor-deposited (CVD) tungsten, a physical vapor deposition (PVD) tungsten, and a plated tungsten.

12. The method of claim 7, wherein a thickness of the conducting material is adjusted so as to completely fill the lower portion of the dual damascene structure.

13. The method of claim 7, wherein said metal comprises copper.

14. The method of claim 7, wherein the metal is removed by chemical mechanical polishing (CMP).

15. The method of claim 7, wherein said selectively removing comprises selectively removing said conductive material by a selective etch.

16. The method of claim 7, wherein said selectively removing comprises selectively removing said conductive material by a selective CMP.

17. The method of claim 7, further comprising:
   repeating said depositing a conducting metal; and
   repeating said depositing a metal over the conducting material, thereby depositing subsequent said conducting material and said metal on the resulting structure.

18. The method of claim 7, wherein said contact is not connected in said substrate to said trough.

19. A method of forming an interconnect on a semiconductor substrate, comprising:
   forming troughs between first and second metal levels, including a slot, in a dielectric formed on a semiconductor substrate;

forming contacts in the dielectric, thereby to form a dual damascene structure;

depositing a conducting material on the dielectric, said conducting, said conducting material completely filling a lower portion of said dual damascene structure;

depositing a metal over the conducting material to completely fill the slot and the troughs;

removing a portion of the metal; and selectively removing the conducting material.

20. The method of claim 19, wherein said conducting material comprises one of a chemical vapor deposition metal, a physical vapor deposition metal, and a plated liner.

21. The method of claim 19, wherein said contact is formed between first and second metal levels formed on the semiconductor substrate.

22. The method of claim 19, wherein said selectively removing comprises selectively removing said conductive material by a selective etch.

23. The method of claim 19, wherein said forming troughs forms said troughs in said dielectric apart from said contact.

24. The method of claim 19, wherein said contact comprise a depth of a range from about 2000 Å to about 8000 Å.

* * * * *